United States Patent
Norenburg et al.

(10) Patent No.: US 11,824,531 B2
(45) Date of Patent: Nov. 21, 2023

(54) SWITCHING DEVICE AND SYSTEM HAVING THE SWITCHING DEVICE FOR CONVERTING A DIFFERENTIAL INPUT SIGNAL

(71) Applicant: SEW-EURODRIVE GMBH & CO. KG, Bruchsal (DE)

(72) Inventors: Benjamin Norenburg, Karlsdorf-Neuthard (DE); Christian Senft, Karlsruhe-Grünwettersbach (DE); Sebastian Richter, Heidelberg (DE); Hans Jürgen Kollar, Bruchsal (DE); Marco Mader, Bruchsal (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 107 days.

(21) Appl. No.: 17/441,874

(22) PCT Filed: Feb. 27, 2020

(86) PCT No.: PCT/EP2020/025099
§ 371 (c)(1),
(2) Date: Sep. 22, 2021

(87) PCT Pub. No.: WO2020/192965
PCT Pub. Date: Oct. 1, 2020

(65) Prior Publication Data
US 2022/0200597 A1    Jun. 23, 2022

(30) Foreign Application Priority Data
Mar. 22, 2019   (DE) .................. 102019002044.8

(51) Int. Cl.
*H03K 17/691*   (2006.01)
*H03K 19/0175*   (2006.01)
(Continued)

(52) U.S. Cl.
CPC ..... *H03K 19/017536* (2013.01); *H03K 17/78* (2013.01); *H03K 19/21* (2013.01); *H04B 10/2589* (2020.05)

(58) Field of Classification Search
CPC .......... H03K 17/78; H03K 19/017536; H03K 19/21; H04B 10/2589
See application file for complete search history.

(56) References Cited

U.S. PATENT DOCUMENTS 6,355,936 B1   3/2002   Mastio
9,899,175 B2   2/2018   Veil et al.
(Continued)

FOREIGN PATENT DOCUMENTS

DE   102013106739 A1   12/2014
FR       2776443 A1    9/1999

OTHER PUBLICATIONS

International Search Report issued in corresponding International Application No. PCT/EP2020/025099, dated Jun. 17, 2020, pp. 1-2, English Translation.

*Primary Examiner* — Kurtis R Bahr
(74) *Attorney, Agent, or Firm* — CARTER, DELUCA & FARRELL LLP (57) ABSTRACT

In a switching device and a system for converting a differential input signal into a ground-referenced output signal using a control signal, error states are detected, and detected error states lead to the deactivation of the ground-referenced output signal and are indicated on the control signal in addition.

24 Claims, 5 Drawing Sheets

(51) Int. Cl.
    *H04B 10/25* (2013.01)
    *H03K 17/78* (2006.01)
    *H03K 19/21* (2006.01)

(56) References Cited

U.S. PATENT DOCUMENTS

| | | |
|---|---|---|
| 2008/0025451 A1 | 1/2008 | Byung-Guk |
| 2008/0297962 A1* | 12/2008 | Hebenstreit ........ H03K 17/6872 |
| | | 361/86 |
| 2010/0253396 A1* | 10/2010 | Matamura ............. H03F 3/2173 |
| | | 327/109 |
| 2010/0327914 A1 | 12/2010 | Behzad |
| 2019/0068088 A1* | 2/2019 | Xu ...................... H02P 29/0241 |

* cited by examiner

SWITCHING DEVICE AND SYSTEM HAVING THE SWITCHING DEVICE FOR CONVERTING A DIFFERENTIAL INPUT SIGNAL

FIELD OF THE INVENTION

The present invention relates to a switching device and to a system for converting a differential input signal.

BACKGROUND INFORMATION

U.S. Patent Application Publication No. 2010/0327914 describes a switching device for converting a differential input signal into a ground-referenced output signal.

U.S. Patent Application Publication No. 2008/0025451 describes a multi-phase signal generator and method thereof.

SUMMARY

Example embodiments of the present invention provide for further development of electronic switching devices.

According to an example embodiment of the present invention, in a device for converting a differential input signal into a ground-referenced output signal using a control signal, error states are detected which particularly are created by faults in the level conversion and/or the signal propagation time, and detected error states lead to the deactivation of the ground-referenced signal and are indicated on the control signal in addition.

For example, a defined state of the ground-referenced output signal is able to be brought about using an unchanged number of interface signals, and a time-optimized error correction can be ensured.

According to example embodiments of the present invention, during the operation, it is possible to detect whether the information of the output signal always corresponds to the information on the input signal.

According to example embodiments of the present invention, error states that are produced by errors in the level conversion and/or the signal propagation time are also detected, and detected error states lead to the deactivation of the output signal and are indicated on the pin of the control signal in addition.

Therefore, example embodiments of the present invention provide the advantage of bringing about a defined state of the output signal using an unchanged number of interface signals, and of providing a time-optimized error correction.

According to example embodiments, the switching device includes a differential stage and an output stage, the differential stage generates a first ground-referenced signal as a function of the differential input signal, delayed by a first signal propagation time t1, and the output stage generates the ground-referenced output signal as a function of the first ground-referenced signal and the control signal, in which the switching device includes a further differential stage, an evaluation stage, and a bidirectional communications stage, the further differential stage generates a second ground-referenced signal as a function of the differential input signal, delayed by a second signal propagation time t2, the second signal propagation time t2, e.g., being much lower than the first signal propagation time t1, and the evaluation stage generates a third ground-referenced signal as a function of the first ground-referenced signal and the second ground-referenced signal while taking the first signal propagation times t1 and second signal propagation time t2 into account, the bidirectional communications stage generates the control signal either as a function of the third ground-referenced signal or as a function of the third ground-referenced signal and of at least one opposite station, the output stage forwarding the first ground-referenced signal to the ground-referenced output signal additionally as a function of the third ground-referenced signal. An opposite station should be understood as a component that is in connection with the switching device and exchanges information with the switching device.

For example, both second propagation time t2 and the second ground-referenced signal may be used as a reference so that errors of the differential stage are able to be detected and reported, and a further deactivation possibility is available for the ground-referenced output signal.

For example, a defined state of the ground-referenced output signal is able to be produced and a time-optimized error correction can be ensured using an unchanged number of interface signals.

According to example embodiments of the present invention, during the operation, it can be recognized whether the information of the output signal always corresponds to the information on the input signal.

Moreover, error states created by errors in the level conversion and/or the signal propagation time are detected, and detected error states lead to the deactivation of the output signal and are indicated on the pin of the control signal in addition.

As a result, example embodiments of the present invention bring about a defined state of the output signal and provide a time-optimized error correction using an unchanged number of the interface signals.

According to example embodiments, the differential stage obtains the ground reference with the aid of an optocoupler. The output signal of the optocoupler is routed via a filter element. A first switching element forwards a supply voltage to the first ground-referenced signal as a function of the output signal of the filter element. The first signal propagation time t1 of the differential stage is composed of the sum of the switching times of the optocoupler and the first switching element and the delay time of the filter element.

For example, a galvanic separation between the differential input signal and the first ground-referenced signal is therefore ensured; interference pulses and/or transients, i.e., usually short-term changes in the signal level in the differential input signal, which are coupled into the actual signal either intentionally such as during testing of an electronic circuit, or unintentionally such as by interference radiation, are suppressed and the first ground-referenced signal has the capability of conducting higher currents, e.g., for the supply of additional switching parts.

According to example embodiments, the further differential stage obtains the second ground-referenced signal with the aid of a further optocoupler. Second signal propagation time t2 of the further differential stage largely corresponds to the switching time of the further optocoupler. For example, this ensures a galvanic separation between the differential input signal and the second ground-referenced signal.

According to example embodiments, the evaluation stage evaluates the first ground-referenced signal and the second ground-referenced signal via at least one first logic gate, e.g., via an XOR logic gate. The output signal of the first logic gate is conducted by a further filter element. The further filter element has a delay time tf. Delay time tf is selected as a function of first signal propagation time t1, second signal propagation time t2, and a signal-propagation tolerance value td, the delay time, for example, corresponding to tf=|t2−t1|+td.

For example, a deviation between the first ground-referenced signal and the second ground-referenced signal with regard to the signal propagation time and the signal level is therefore detectable.

According to example embodiments, the further filter element includes an RC filter and a second logic gate, e.g., an inverting logic gate. The nominal values of the RC filter are selected to be tf=R*C. The second logic gate digitizes the output signal of the RC filter and generates the output signal of the further filter element. More specifically, the second logic gate utilizes CMOS technology. This makes it possible to set delay time tf in a cost-effective and space-saving manner.

According to example embodiments, the output signal of the further filter element corresponds to the third ground-referenced signal.

According to example embodiments, the output signal of the further filter element sets a memory element, e.g., an RS flip-flop. The output signal of a third logic gate, e.g., a WIRED-OR logic gate, resets the memory element. The third logic gate evaluates the first ground-referenced signal and the second ground-referenced signal. The output signal of the memory element corresponds to the third ground-referenced signal. Thus, a detected error state is able to be stored until both the level of the first ground-referenced signal and the level of the second ground-referenced signal are at the ground potential.

According to example embodiments, the bidirectional communications stage has a communications interface, e.g., an open drain interface, including a pull-up resistor with respect to the supply voltage or to a further supply voltage. The control signal is able to be short-circuited to ground potential via a second switching element as a function of the third ground-referenced signal, e.g., in an inverting manner. An interface that allows an information flow in both directions via only a single signal can thus be provided.

According to example embodiments, the output stage has a fourth switching element and at least one fourth logic gate. The fourth switching element conducts the first ground-referenced signal to at least one supply-voltage input of the fourth logic gate as a function of the third ground-referenced signal. The fourth logic gate generates the ground-referenced output signal as a function of the signal at the supply-voltage input and the control signal. For example, a differentially-redundant deactivation of the ground-referenced output signal is thereby able to be obtained, a 'differentially-redundant deactivation' describing an equal-priority multi-stage deactivation using different function principles, which is able to set the ground-referenced output signal into a defined state both as a function of the supply-voltage input of the fourth logic gate and as a function of the control signal at the signal input of the fourth logic gate.

According to example embodiments, the output signal of the filter element of the differential stage is additionally forwarded as a fourth ground-referenced signal to the output stage. The fourth logic gate of the output stage is arranged as an AND logic gate with inverting inputs or as a NOR logic gate and generates the ground-referenced output signal in addition as a function of the fourth ground-referenced signal. For example, the ground-referenced output signal is therefore able to be rapidly deactivated in a manner that is optimized with regard to the propagation time, e.g., without the delay times of the first and fourth switching elements.

According to example embodiments, error states which arise from errors on a further voltage supply are detected. An additional error diagnosis is therefore made available.

According to example embodiments, the switching device includes a supply-voltage protection stage, which generates the supply voltage as a function of the signal level of the further supply voltage. The voltage level of the further supply voltage is monitored in the process, and a voltage supply voltage level within a valid range, e.g., within +3 VDC to +3.5 VDC, leads to the forwarding of the further supply voltage to the supply voltage, and a voltage level outside the valid range leads to a separation between the further supply voltage and the supply voltage. For example the switching device can therefore be protected from interference that is introduced into the system via the supply voltage.

According to example embodiments, a system including the switching device has a safety-directed switching device and a frequency converter. The differential input signal (S_DIFF_IN) is able to be generated by the safety-directed switching device. The control signal (S_EXT) is able to be evaluated and actuated by the frequency converter. The ground-referenced output signal (S_OUT) may be used for interrupting a rotating field generation of the frequency converter.

According to example embodiments, the control signal (S_EXT) is able to be short-circuited to ground potential (GND) via at least one third switching element in the frequency converter.

According to example embodiments, a bus driver component is able to be supplied with voltage via the ground-referenced output signal (S_OUT) for the transmission of PWM signals for the rotating field generation of the frequency converter.

Further features and aspects of example embodiments of the present invention are described in greater detail below with reference to the appended Figures.

DETAILED DESCRIPTION

Figure 1:
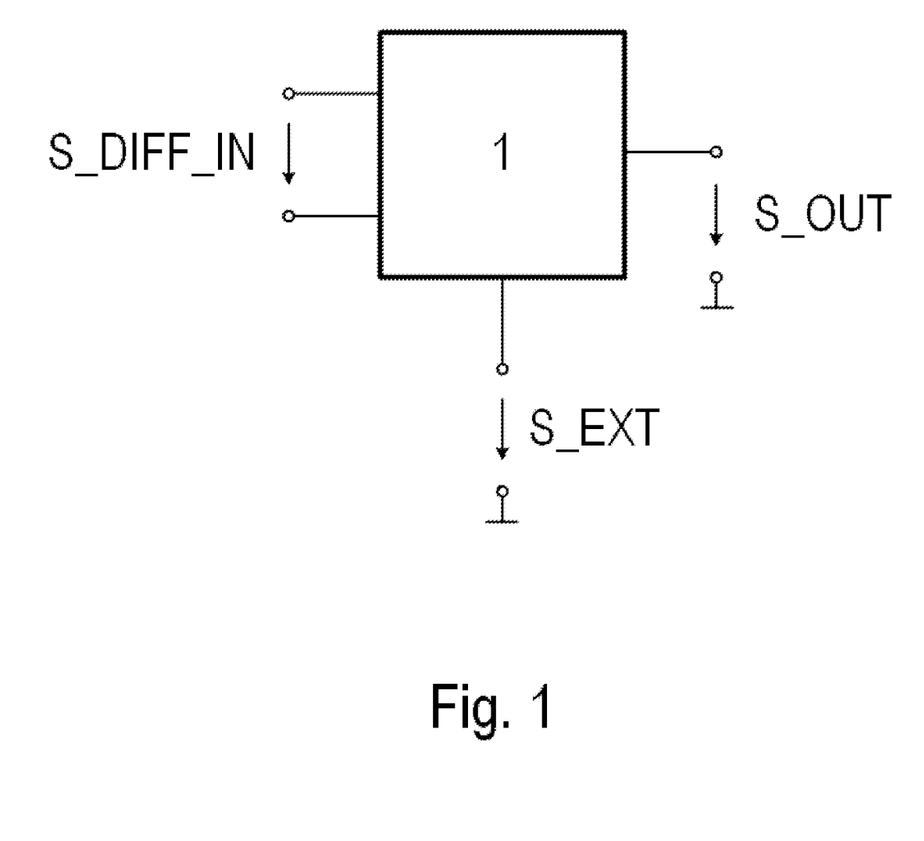
FIG. 1 schematically illustrates external interfaces of a switching device.

FIG. 1 shows the external interfaces of the switching device (1). According to example embodiments of the present invention, the switching device (1) has three external interfaces. The differential input signal (S_DIFF_IN) is recorded, converted, and output as ground-referenced output signal (S_OUT) as a function of the control signal (S_EXT). The differential input signal (S_DIFF_IN) is a signal that is transmitted in a symmetrical manner, i.e., using a pair of signal conductors of the same type.

Typically, an information signal is transmitted on the first signal conductor and a static reference signal or a signal that is identical to the first signal but inverted is transmitted as a reference on the second signal conductor. The differential voltage of the differential input signal (S_DIFF_IN) is, for example, within a voltage range of −30 V DC to +60 V DC, the switching device, e.g., being capable of interpreting a differential signal level of less than +5 V DC as a LOW level and a differential signal level of more than +11 V DC as a HIGH level and to set the ground-referenced output signal (S_OUT) as a function of these interpreted level states and as a function of the control signal (S_EXT).

Figure 2:
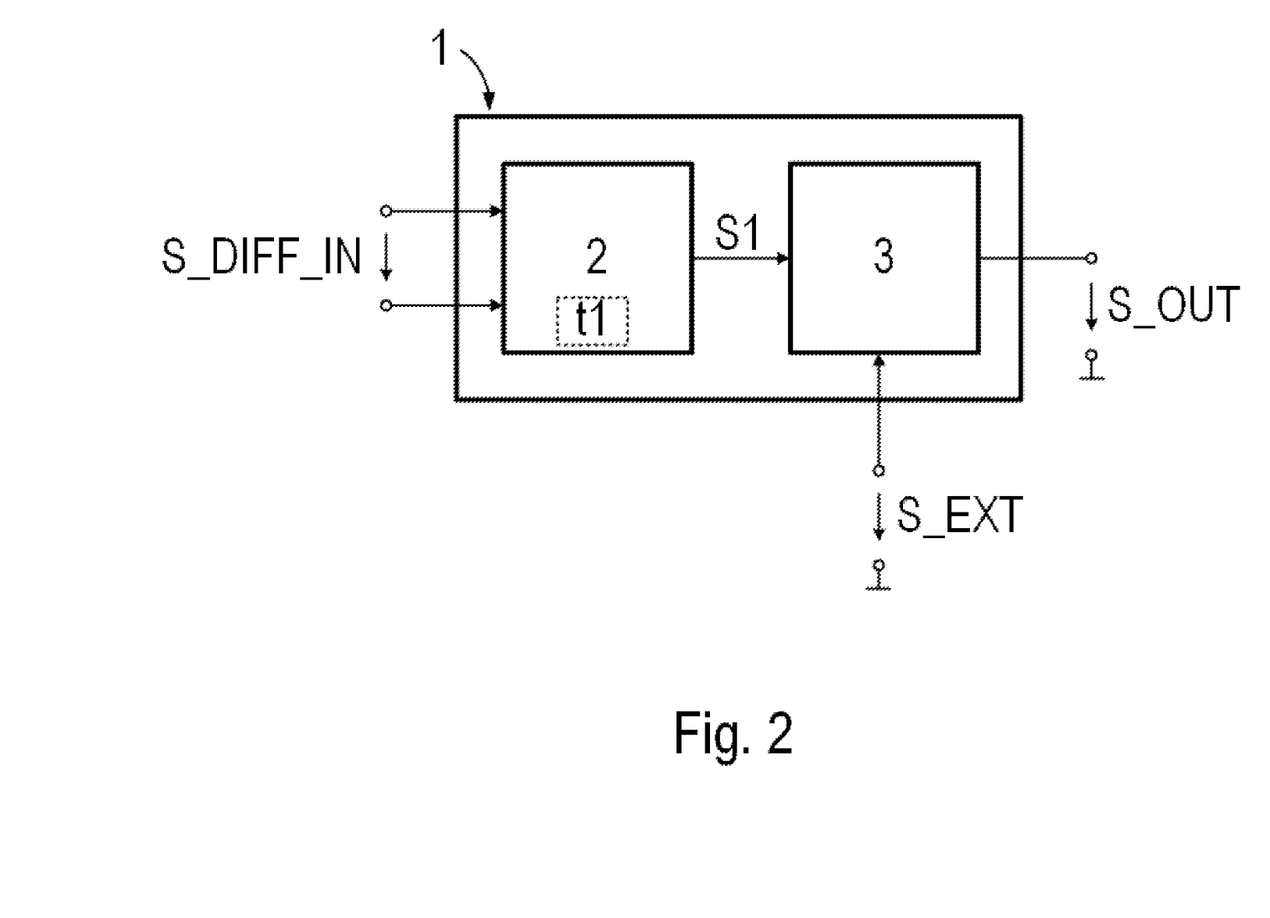
FIG. 2 schematically illustrates a switching device.

FIG. 2 shows a possible conventional arrangement of a switching device (1). The switching device is further refined by subdividing it into a differential stage (2) and an output stage (3).

The differential stage (2) generates the first ground-referenced signal (S1) from the differential input signal (S_DIFF_IN). First signal propagation time t1, that is to say, the time that a state change on the differential input signal (S_DIFF_IN) requires until it is indicated on the first ground-referenced signal (S1), is the result of the internal structure of the differential stage (2).

The output stage (3) makes the ground-referenced output signal (S_OUT) available at the output for the further use within a system. The state of the control signal (S_EXT) decides whether the level of the first ground-referenced signal (S1) is mapped to the ground-referenced output signal (S_OUT) or whether the ground-referenced output signal (S_OUT) is pulled into a defined state, typically to ground potential (GND).

Figure 3:
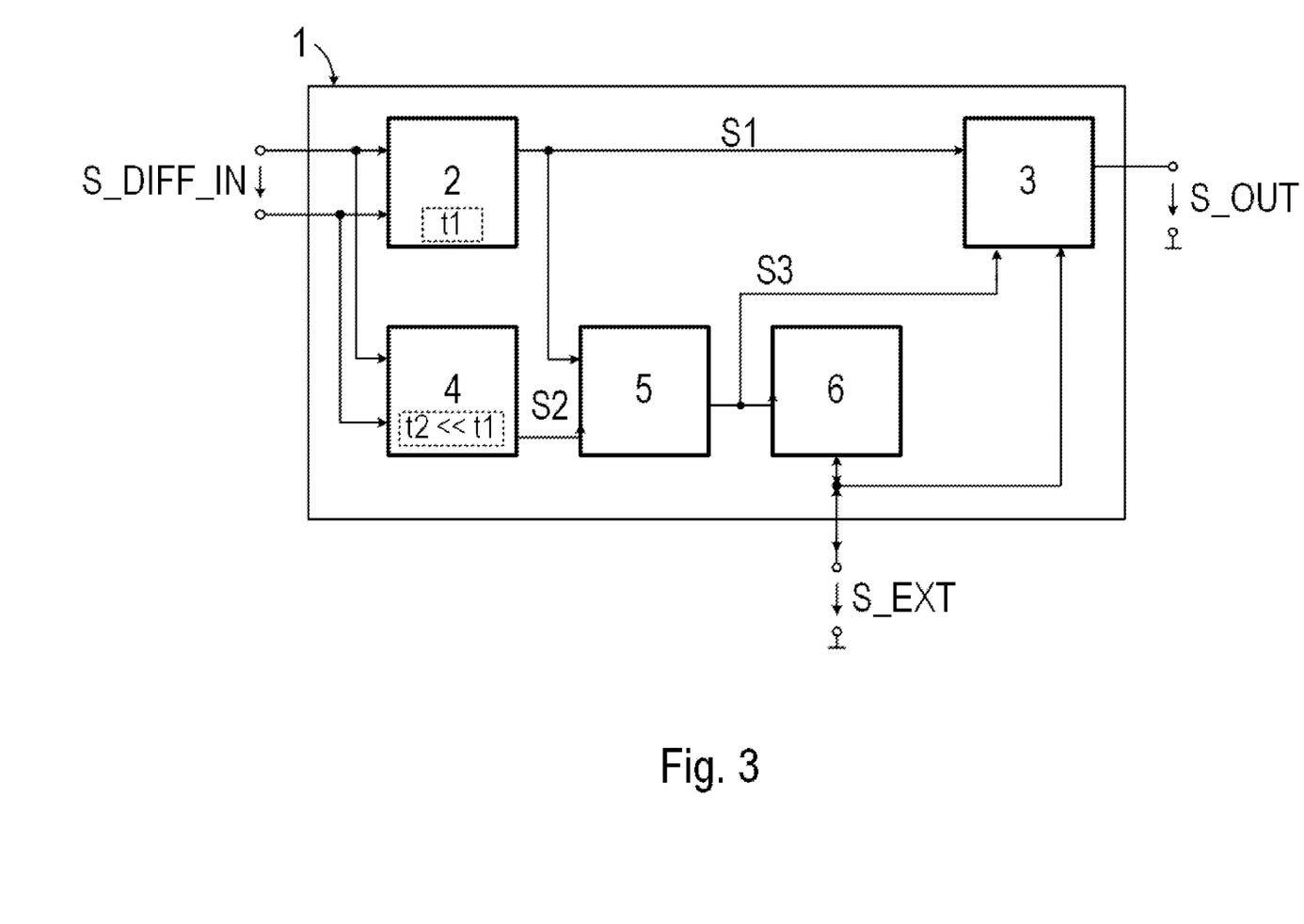
FIG. 3 schematically illustrates a switching device.

FIG. 3 shows a switching device (1) according to an example embodiment of the present invention. The switching device (1) is further refined in that in addition to the differential stage (2) and the output stage (3), a further differential stage (4), an evaluation stage (5) and a bidirectional communications stage (6) are inserted.

The further differential stage (4) generates the second ground-referenced signal (S2) from the differential input signal (S_DIFF_IN). Second signal propagation time t2, that is to say, the time that a state change on the differential input signal (S_DIFF_IN) requires until it is indicated on the second ground-referenced signal (S2), results from the internal structure of the further differential stage (2). The internal structure of the further differential stage (2) is, for example, selected so that a second signal propagation time t2 results that is much shorter than first signal propagation time t1 of the differential stage (2).

The evaluation unit (5) compares the first ground-referenced signal (S1) to the second ground-referenced signal (S2) and generates the third ground-referenced signal (S3) as a function of the result of this comparison.

This provides a test which monitors the operativeness of the differential stage (2) and, in a deviation from the signal behavior of the further differential stage (4) as a reference and taking the first signal propagation time t1 and second signal propagation time t2 into account, makes this information available within the switching device (1) to further function blocks.

In contrast to conventional arrangements, the bidirectional communications stage (6) has an interface for the control signal (S_EXT), which is able to process both an item of control information to the switching device (1) and an item of report information from the switching device (1).

The output stage (3) uses the third ground-referenced signal (S3). The state of the third ground-referenced signal (S3) and of the control signal (S_EXT) decides whether the level of the first ground-referenced signal (S1) is mapped to the ground-referenced output signal (S_OUT) or whether the ground-referenced output signal (S_OUT) is pulled into a defined state, frequently to ground potential (GND).

Figure 4:
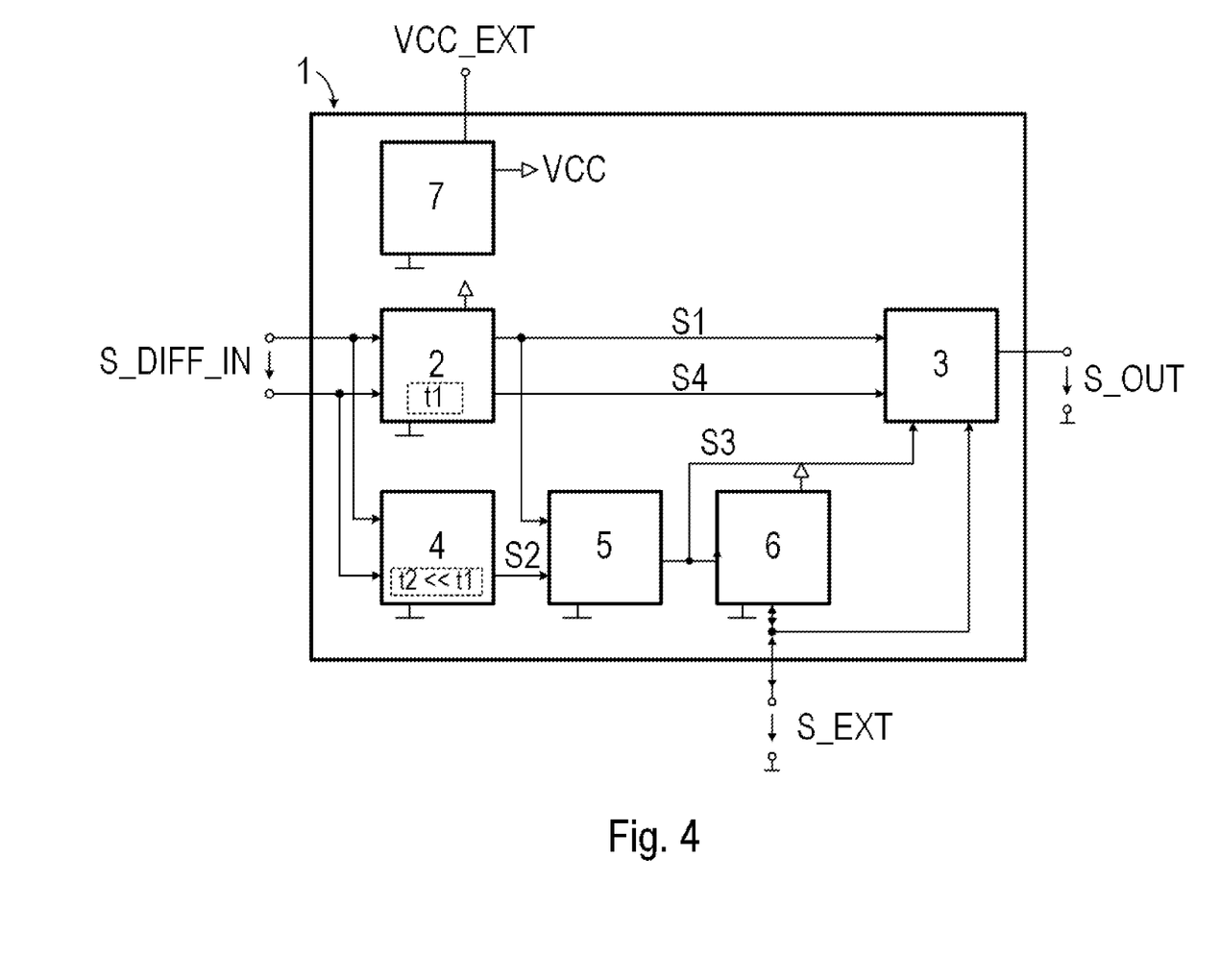
FIG. 4 schematically illustrates a switching device.

FIG. 4 shows a switching device (1) according to an example embodiment of the present invention. The device illustrated in FIG. 4 includes a supply-voltage protection stage (7) and a fourth ground-referenced signal (S4).

The supply voltage protection stage (7) is connected upstream from the input of the supply voltage (VCC) and monitors the actual supply voltage for the operation of the switching device (1), in this example denoted as further supply voltage (VCC_EXT), for a valid voltage range. Voltage levels of the further supply voltage (VCC-EXT) within the valid voltage range cause the further supply voltage (VCC_EXT) to be forwarded onto the supply voltage (VCC). Voltage levels of the further supply voltage (VCC_EXT) outside the valid voltage range cause the further supply voltage (VCC_EXT) to be separated from the supply voltage (VCC) so that a voltage-free state is present on the supply voltage (VCC).

The voltage-free state has the result that both the ground-referenced output signal (S_OUT) and the control signal (S_EXT) are at or at least close to the ground potential (GND). In addition, the fourth ground-referenced signal (S4) is generated in the differential stage (2), which is additionally evaluated by the output stage (3).

The state of the third ground-referenced signal, the state of the fourth ground-referenced signal (S4), and the state of the control signal (S_EXT) decide whether the level of the first ground-referenced signal (S1) is mapped to the ground-referenced output signal (S_OUT) or whether the ground-referenced signal (S_OUT) is pulled into a defined state, typically to ground potential (GND). In particular, the supply voltage protection stage (7) is dimensioned such that supply voltage levels at least in the range of −0.5 V DC to +15 V DC are able to be applied at the input for receiving the further supply voltage (VCC_EXT).

In addition, the generation and evaluation of the fourth ground-referenced signal (S4) is provided so that a rapid deactivation of the ground-referenced output signal (S_OUT) is obtained that is optimized in terms of the propagation time.

Figure 5:
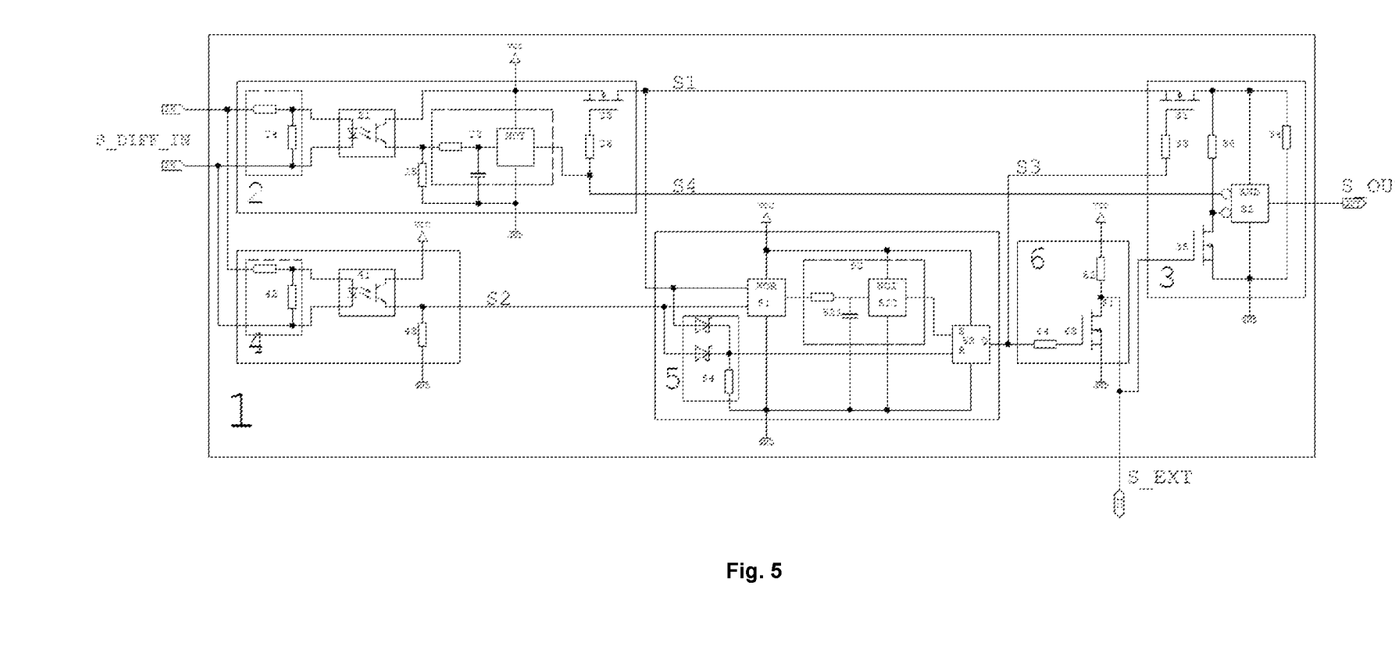
FIG. 5 schematically illustrates an implementation of a switching device.

An exemplary implementation of the switching device (1) according to an example embodiment of the present invention is illustrated in FIG. 5. Starting from FIG. 4, the function blocks of differential stage (2), output stage (3), further differential stage (4), evaluation stage (5), and bidirectional communications stage (6) are further refined and a possible arrangement in terms of switching technology is indicated.

In differential stage (2), the differential input signal (S_DIFF_IN) is evaluated with the aid of an optocoupler (21).

The input of the optocoupler (21) is wired to a resistor-type voltage divider (24). At the output, the optocoupler (21) switches the supply voltage (VCC) with respect to a pull-down resistor (25). The output signal of the optocoupler (21) is conducted via a filter element (22), which includes an RC filter element (22) including and/or consisting of an RC filter and an inverting logic gate, e.g., an inverting logic gate having a Schmitt trigger input.

The output signal of the inverting logic gate simultaneously forms the output signal of the filter element (22) and is made available as a fourth ground-referenced signal (S4) to a downstream function block. In addition, via a series resistor (26), the output signal of the filter element (22) is also used for the actuation of the first switching element (23), which is arranged as a PFET transistor in this example. The PFET transistor has the capability of conducting the supply voltage (VCC) via the first ground-referenced signal (S1) to a plurality of downstream function blocks.

In the further differential stage (4), the differential input signal (S_DIFF_IN) is evaluated with the aid of a further optocoupler (41). The input of the further optocoupler (41)

is connected by a further resistor-type voltage divider (42). At the output, the further optocoupler (41) connects the supply voltage with respect to a further pull-down resistor (43) and the output signal of the further optocoupler (41) is directly forwarded to a downstream function block as a second ground-referenced signal.

The evaluation stage (5) compares the first ground-referenced signal (S1) to a second ground-referenced signal (S2) with the aid of a first logic gate (51), which is arranged as an XOR logic gate in this case.

The output of the first logic gate (51) is routed via a further filter element (52), which includes an RC filter (521) and a second logic gate (522), e.g., a second inverting logic gate (522) provided with a Schmitt trigger input. The output signal of the second logic gate (522) simultaneously forms the output signal of the further filter element (52) in this case and is used for actuating the set input of an RS flip-flop (53). Moreover, both the first ground-referenced signal (S1) and the second ground-referenced signal (S2) are logically linked with each other via a WIRED OR circuit (54), which includes a diode in the signal path to the corresponding signal in each case, and connected to ground potential (GND) via a pull-down resistor.

The output signal of the WIRED OR circuit is used for resetting the RS flip-flop (53). The RS flip-flop (53) is, for example, arranged such that its inputs are LOW-active. A device arranged in this manner in terms of switching technology makes it possible to apply different voltage levels between the first ground-referenced signal (S1) and the second ground-referenced signal (S2), which are applied for a duration t that is greater than a defined delay time tf that results from the selection of the components of the RC filter and lead to the setting of the RS flip-flop, and the RS flip-flop (53) can be reset only if a low level, i.e., a signal level close to the ground level (GND), is applied both on the first ground-referenced signal (S1) and the second ground-referenced signal (S2).

The output signal of the RS flip-flop (53) simultaneously forms the output signal of the evaluation stage (5) and is made available as third ground-referenced signal (S3) to further downstream function blocks.

The bidirectional communications stage (6) uses the third ground-referenced signal (S3) to actuate a second switching element (63), which is arranged as an NFET transistor, via a series resistor (64). In cooperation with an additional pull-up resistor (62) which is connected to the supply voltage (VCC), the NFET transistor forms a communications interface (61), which is arranged as an open drain interface and is capable of pulling the control signal (S_EXT) to ground potential (GND) as a function of the third ground-referenced signal (S3). Both the bidirectional communications stage (6) and an opposite station optionally connected thereto are therefore able to pull the control signal (S_EXT) to a LOW level. If neither the bidirectional communications stage (6) nor the opposite station actuates the signal (S_EXT), a HIGH level is always present on the signal (S_EXT) because of the pull-up resistor (62).

The output stage (3) also uses the third ground-referenced signal (S3) to actuate, via a series resistor (33), a fourth switching element (31), which is arranged as a PFET transistor in this example. The PFET transistor is able to conduct the first ground-referenced signal (S1), and thus the supply voltage (VCC), to the supply voltage input of a fourth logic gate (32), which is arranged as an AND logic gate having inverting inputs. At the same time, the supply voltage input of the AND logic gate is connected to the ground potential (GND) via a pull-down resistor (34). The control signal (S_EXT) controls a fifth switching element (35), which is arranged as an NFET transistor in this example. This NFET transistor connects the ground potential (GND) with respect to a pull-up resistor (36), which is likewise referenced to the supply-voltage input of the AND logic gate.

With the aid of this transistor circuit, the voltage level on the control signal (S_EXT) is inverted and connected to one of the inverting inputs of the AND logic gate. A further inverting input of the AND logic gate is connected to the fourth ground-referenced signal (S4). The output signal of the AND logic gate simultaneously forms the output signal of the output stage (3) and thus also the ground-referenced output signal (S_OUT) of the switching device (1) hereof.

This configuration in terms of switching technology allows the output stage (3) to rapidly deactivate the ground-referenced output signal (S_OUT) caused by the fourth ground-referenced signal (S4) and the control signal (S_EXT) with the aid of the fourth logic gate (32). Via the first ground-referenced signal (S1) and the third ground-referenced signal (S3), a differentially redundant slow deactivation of the ground-referenced output signal (S_OUT) is induced in addition, which is caused by the parasitic residual capacitances during the deactivation of the supply voltage which will first have to be discharged. However, the supply voltage deactivation guarantees that the ground-referenced output signal (S_OUT) is able to be deactivated even when a malfunction of the fourth logic gate (32) occurs.

The control signal (S_EXT) is able to be used for controlling the output stage (3), for example.

The control signal (S_EXT) is generated both by the bidirectional communications stage (6) and an opposite station which is optionally connected to the switching device (1).

In the exemplary implementation illustrated in FIG. 5, a HIGH level of the control signal (S_EXT) means a release of the output stage (3), and a LOW level of the control signal (S_EXT) means a blockage of the output stage (3).

The LOW level is dominant. A HIGH level therefore results on the signal (S_EXT) only when the communications stage (6) and the opposite station jointly release the output stage (3).

If the opposite station wants to release the output stage (3) but measures a LOW level, then the opposite station may take that as an indication that the switching device (1) is in an error state.

It is pointed out once again that the output stage (3) evaluates the signal (S_EXT) in order to map the first ground-referenced signal (S1) to the ground-referenced output signal (S_OUT) as a function thereof or in order to pull the ground-referenced output signal (S_OUT) into a defined state, typically to the ground potential (GND), while the signal (S_EXT) is generated by the bidirectional communications stage (6) in combination with an opposite station optionally connected thereto.

In addition, the following applies in this context: in contrast to conventional arrangements, the bidirectional communications stage (6) has an interface for the control signal (S_EXT) which is able to process both control information to the switching device (1) and report information from the switching device (1).

The following is therefore induced. The bidirectional communications stage (6) subsequently uses the third ground-referenced signal (S3) in order to actuate a second switching element (63), which is arranged as an NFET transistor in this example, via a series resistor (64). The NFET transistor in conjunction with an additional pull-up resistor (62), which is connected to the supply voltage (VCC), forms a communications interface (61), which is arranged as an open drain interface in this example and has the capability of pulling the control signal (S_EXT) to the ground potential (GND) as a function of the third ground-referenced signal (S3). Both the bidirectional communications stage (6) and an opposite station optionally connected thereto are therefore able to pull the control signal (S_EXT) to a LOW level. If neither the bidirectional communications stage (6) nor the opposite station actuates the signal (S_EXT), then a HIGH level is always present on the signal (S_EXT) on account of the pull-up resistor (62).

The following list of reference characters is incorporated into the description and describes further features hereof.

LIST OF REFERENCE CHARACTERS 1 switching device
2 differential stage
21 optocoupler
22 filter element
23 first switching element
24 resistor-type voltage divider
25 pull-down resistor
26 series resistor
3 output stage
31 fourth switching element
32 fourth logic gate
33 series resistor
34 pull-down resistor
35 fifth switching element
36 pull-up resistor
4 further differential stage
41 further optocoupler
42 further resistor-type voltage divider
43 further pull-down resistor
5 evaluation stage
51 first logic gate
52 further filter element
521 RC filter
522 second logic gate
53 memory element
54 third logic gate
6 bidirectional communications stage
61 communications interface
62 pull-up resistor
63 second switching element
64 series resistor
7 supply-voltage protection stage
GND ground potential
t duration
t1 first signal propagation time
t2 second signal propagation time
td signal-propagation time tolerance value
tf delay time
S1 first ground-referenced signal
S2 second ground-referenced signal
S3 third ground-referenced signal
S4 fourth ground-referenced signal
S_DIFF_IN differential input signal
S_EXT control signal
S_OUT ground-referenced output signal
VCC supply voltage
VCC_EXT further supply voltage

The invention claimed is:

1. A system, comprising:
a switching device adapted to convert a differential input signal into a ground-referenced output signal using a control signal, the switching device adapted to detect error states, to, based on the detected error states, deactivate the ground-reference output signal, and to indicate the detected error states on the control signal; and
a first differential stage, a second differential state, an output stage, an evaluation stage, and a bidirectional communications stage, the first differential stage adapted to generate a first ground-referenced signal as a function of a differential input signal, delayed by a first signal propagation time, the output stage adapted to generate the ground-referenced output signal as a function of the first ground-referenced signal and the control signal, the second differential stage adapted to generate a second ground-referenced signal as a function of the differential input signal, delayed by a second signal propagation time, the evaluation stage adapted to generate a third ground-referenced signal as a function of the first ground-referenced signal and the second ground-referenced signal while taking into account the first signal propagation time and the second signal propagation time, the bidirectional communications stage adapted to generate the control signal as a function of the third signal or as a function of the third signal and at least one opposite station, the output stage adapted to forward the first ground-referenced signal to the ground-referenced output signal additionally as a function of the third ground-referenced signal.

2. The system according to claim 1, wherein the error state are produced in a level conversion and/or a signal propagation time.

3. The system according to claim 1, wherein the switching device is adapted to, based on the detected error states, deactivate the ground-reference output signal, and to indicate the detected error states on the control signal, in order to bring about a defined signal state on the ground-referenced output signal using an unchanged number of interface signals, and to provide a time-optimized error correction.

4. The system according to claim 1, wherein the second signal propagation time is lower than the first signal propagation time.

5. The system according to claim 1, wherein the differential stage is adapted to obtain the ground reference by an optocoupler, an output signal of the optocoupler being routed via a filter element, and a first switching element is adapted to forward a supply voltage to the first ground-referenced signal as a function of an output signal of the filter element, the first signal propagation time of the differential stage being composed of a sum of switching times of the optocoupler and the first switching element and a delay time of the filter element.

6. The system according to claim 5, wherein the second differential stage is adapted to obtains the second ground-referenced signal by a second optocoupler, the second signal propagation time of the second differential stage substantially corresponding to a switching time of the second optocoupler.

7. The system according to claim 1, wherein the evaluation stage is adapted to evaluate the first ground-referenced signal and the second ground-referenced signal via at least one first logic gate and to conduct an output signal of the first logic gate via a further filter element having a delay time a function of the first signal propagation time, the second signal propagation time, and a signal-propagation tolerance value.

8. The system according to claim 7, wherein the delay time satisfies the relationship: tf=|t2−t1|+td, tf representing the delay time, t1 representing the first signal propagation time, t2 representing the second signal propagation time, and td representing the signal-propagation tolerance value.

9. The system according to claim 7, wherein the first logic gate includes an XOR logic gate.

10. The system according to claim 7, wherein the further filter element includes an RC filter and a second logic gate, the second logic gate adapted to digitize an output signal of the RC filter and to generate an output signal of the further filter element.

11. The system according to claim 10, wherein the second logic gate includes an inverting logic gate and/or includes CMOS technology.

12. The system according to claim 10, wherein the output signal of the further filter element corresponds to the third ground-referenced signal.

13. The system according to claim 10, wherein the output signal of the further filter element sets a memory element, and an output signal of a third logic gate resets the memory element, the third logic gate adapted to evaluate the first ground-referenced signal and the second ground-referenced signal, an output signal of the memory element corresponds to the third ground-referenced signal.

14. The system according to claim 13, wherein the memory element includes an RS flip-flop, and the third logic gate includes a WIRED-OR logic gate.

15. The system according to claim 1, wherein the bidirectional communications stage includes a communications interface, including a pull-up resistor with respect to the supply voltage or to a further supply voltage, a second switching element adapted to short-circuit the control signal to ground potential as a function of the third ground-referenced signal.

16. The system according to claim 15, wherein the communications interface includes an open drain interface.

17. The system according to claim 1, wherein the output stage includes a fourth switching element and at least one fourth logic gate, the fourth switching element adapted to conduct the first ground-referenced signal to at least one supply-voltage input of the fourth logic gate as a function of the third ground-referenced signal.

18. The system according to claim 17, wherein the fourth logic gate is adapted to generate the ground-referenced output signal as a function of a signal at a supply-voltage input and the control signal.

19. The system according to claim 17, wherein an output signal of the filter element of the first differential stage is forwarded as a fourth ground-referenced signal to the output stage, the fourth logic gate of the output stage arranged as an AND logic gate with inverting inputs or as a NOR logic gate, and adapted to generate the ground-referenced output signal as a function of the fourth ground-referenced signal.

20. The system according to claim 1, wherein the switching device is adapted to detect error states that arise from errors on a further supply voltage.

21. A system, comprising:
a switching device adapted to convert a differential input signal into a ground-referenced output signal using a control signal, the switching device adapted to detect error states, to, based on the detected error states, deactivate the ground-reference output signal, and to indicate the detected error states on the control signal;
wherein the switching device is adapted to detect error states that arise from errors on a further supply voltage; and
wherein the switching device includes a supply-voltage protection stage adapted to generate a supply voltage as a function of a signal level of the further supply voltage, the switching device adapted to monitor a voltage level of the further supply voltage, and to forward, based on a voltage level being within a valid range, the further supply voltage to the supply voltage, and to separate, based on a voltage level outside the valid range, between the further supply voltage and the supply voltage.

22. The system according to claim 21, wherein the valid range is between +3.0 V DC and +3.5 V DC.

23. A system, comprising:
a switching device adapted to convert a differential input signal into a ground-referenced output signal using a control signal, the switching device adapted to detect error states, to, based on the detected error states, deactivate the ground-reference output signal, and to indicate the detected error states on the control signal;
a safety-directed switching device adapted to generate the differential input signal; and
a frequency converter adapted to evaluate and actuate the control signal;
wherein the ground-referenced output signal adapted to interrupt a rotating field generation of the frequency converter.

24. The system according to claim 23, wherein at least one switching element of the frequency converter is adapted to short-circuit the control signal to a ground potential, and/or wherein a bus driver component is adapted to be supplied with voltage via the ground-referenced output signal for transmission of PWM signals for the rotating field generation of the frequency converter.

* * * * *